United States Patent
Lee

(10) Patent No.: US 9,824,778 B2
(45) Date of Patent: Nov. 21, 2017

(54) NONVOLATILE MEMORY SYSTEM AND DATA RECOVERY METHOD THEREOF

(71) Applicant: SK hynix Inc., Gyeonggi-do (KR)

(72) Inventor: Hyung-Min Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 279 days.

(21) Appl. No.: 14/674,975

(22) Filed: Mar. 31, 2015

(65) Prior Publication Data

US 2016/0124804 A1    May 5, 2016

(30) Foreign Application Priority Data

Nov. 3, 2014    (KR) .................... 10-2014-0151150

(51) Int. Cl.
| | | |
|---|---|---|
| *G11C 29/52* | (2006.01) | |
| *G11C 16/34* | (2006.01) | |
| *G11C 29/42* | (2006.01) | |
| *G06F 11/10* | (2006.01) | |
| *G11C 29/54* | (2006.01) | |

(52) U.S. Cl.
CPC .......... *G11C 29/52* (2013.01); *G06F 11/1048* (2013.01); *G11C 16/3418* (2013.01); *G11C 29/42* (2013.01)

(58) Field of Classification Search
CPC ..... G11C 29/52; G11C 16/3418; G11C 29/42; G11C 29/50; G06F 11/1048
See application file for complete search history.

(56) References Cited

U.S. PATENT DOCUMENTS

| | | | |
|---|---|---|---|
| 2008/0244360 A1 | 10/2008 | Mokhlesi et al. | |
| 2008/0244367 A1 | 10/2008 | Chin et al. | |
| 2008/0244368 A1 | 10/2008 | Chin et al. | |
| 2010/0199149 A1* | 8/2010 | Weingarten | G06F 11/1068 714/773 |
| 2010/0223538 A1* | 9/2010 | Sakurada | G06F 11/1072 714/801 |
| 2011/0231738 A1* | 9/2011 | Horisaki | G06F 11/1072 714/773 |
| 2011/0252283 A1 | 10/2011 | Mokhlesi et al. | |
| 2011/0280084 A1* | 11/2011 | Radke | G11C 11/26 365/185.21 |
| 2012/0221772 A1* | 8/2012 | Seol | G06F 13/1668 711/103 |

* cited by examiner

*Primary Examiner* — April Y Blair
*Assistant Examiner* — Dipakkumar Gandhi
(74) *Attorney, Agent, or Firm* — IP & T Group LLP

(57) ABSTRACT

A nonvolatile memory system includes a nonvolatile memory device including a distribution table suitable for storing recovery read level intervals that are set by being changed through multiple stages according to a distribution value of threshold voltage levels of a plurality of memory cells, measured at a reference read level, is changed through the multiple stages; and a memory controller suitable for reading measurement data from the memory cells by additionally using a measurement read level, searching for a difference value between the normal data and the measurement data from the multiple stages of distribution values stored in the distribution table, and recovering the normal data based on a recovery read level interval corresponding to a searched distribution value, when an error occurs in normal data read from the memory cells by using the reference read level.

18 Claims, 10 Drawing Sheets

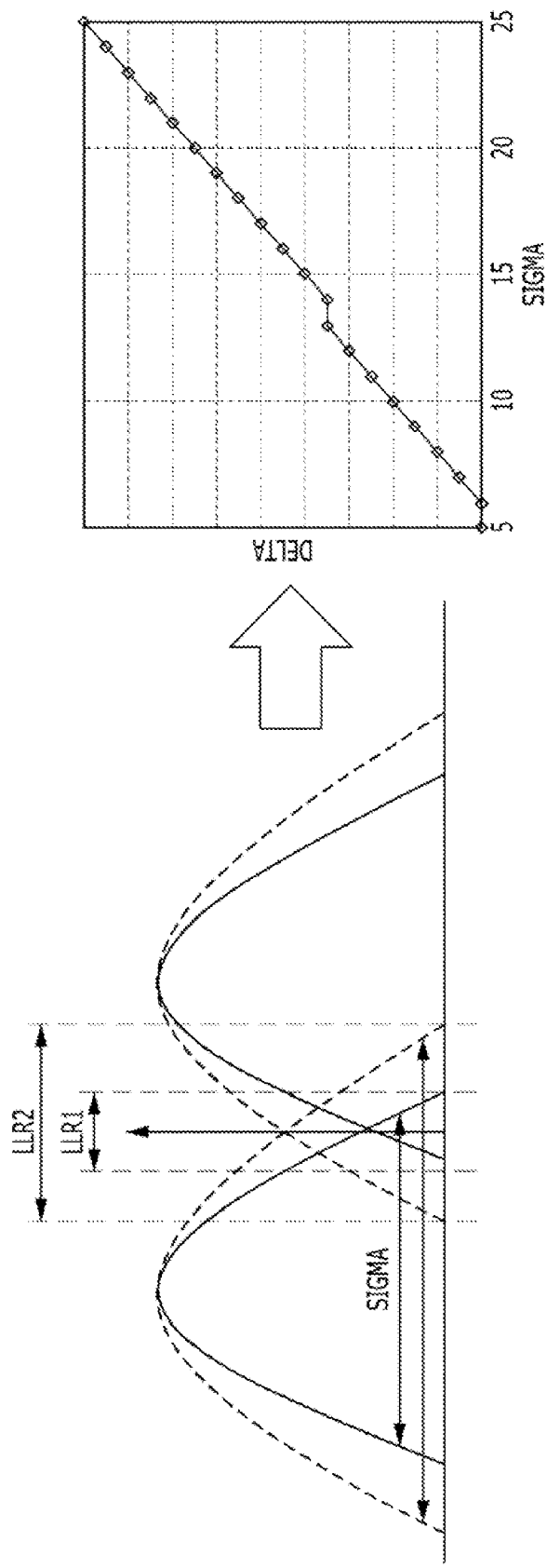

NONVOLATILE MEMORY SYSTEM AND DATA RECOVERY METHOD THEREOF

CROSS-REFERENCE TO RELATED APPLICATIONS

The present application claims priority of Korean Patent Application No. 10-2014-0151150, filed on Nov. 3, 2014, which is incorporated herein by reference in its entirety.

BACKGROUND

1. Field

Exemplary embodiments of the present invention relate to a semiconductor design technology and, more particularly, to a data recovery method of a nonvolatile memory device.

2. Description of the Related Art

Semiconductor memory devices included in a data storage system are generally divided into volatile memory devices and nonvolatile memory devices.

A volatile memory device may perform write and read operations at high speed, but data stored therein are lost when its power supply is blocked. On the other hand, in a nonvolatile memory device, the stored data may be retained even without power. However, write and read speeds are relatively slow. Therefore, to retain data regardless of whether there is a constant power supply, a nonvolatile memory device is used. Nonvolatile memory devices include read only memory (ROM), mask ROM (MROM), programmable ROM (PROM), erasable programmable ROM (EPROM), electrically erasable programmable ROM (EEPROM), flash memory, phase change random access memory (PRAM) magnetic RAM (MRAM), resistive RAM (RRAM), and ferroelectric RAM (FRAM). The flash memory may be NOR type or NAND type.

The flash memory has advantages of RAM in that program and erase operations may be freely performed, and advantages of ROM in that the stored data may be retained even without a constant source of power. Flash memories are widely used as storage media of portable electronic appliances such as digital cameras, personal digital assistants (PDA) and MP3 players.

Reliability of data in memory storage systems is regarded as an important issue.

SUMMARY

Various embodiments of the present invention are directed to nonvolatile memory systems using a data recovery method capable of achieving high data reliability while minimizing deterioration of performance.

In an embodiment, a nonvolatile memory system may include: a nonvolatile memory device including a distribution table suitable for storing recovery read level intervals that are set by being changed through multiple stages according to a distribution value of threshold voltage levels of a plurality of memory cells, measured at a reference read level, is changed through the multiple stages; and a memory controller suitable for reading measurement data from the memory cells by additionally using a measurement read level, searching for a difference value between the normal data and the measurement data from the multiple stages of distribution values stored in the distribution table, and recovering the normal data based on a recovery read level interval corresponding to the searched distribution value, when an error occurs in normal data read from the memory cells by using the reference read level.

In an embodiment, after setting, in advance, cases where the distribution value of the threshold voltage levels of a plurality of memory cells, measured at the reference read level, is changed through the multiple stages through test operations to generate the multiple stages of distribution values, the recovery read level intervals predicted through the multiple stages are set according to distribution values measured in the respective cases and may be stored in the distribution table.

In an embodiment, in the each of the cases through the test operations, after reading data stored in the memory cells by respectively using the reference read level and the measurement read level, a difference between two read data values may be measured as any one distribution value among the multiple stages of distribution values.

In an embodiment, in the each of the cases through the test operations, a recovery read level interval with a relatively large level interval among the multiple stages of recovery read level intervals may be set in correspondence to a distribution value with a relatively large value among the multiple stages of distribution values, and a recovery read level interval with a relatively small level interval among the multiple stages of recovery read level intervals may be set in correspondence to a distribution value with a relatively small value among the multiple stages of distribution values.

In an embodiment, the nonvolatile memory device may further include: a read operation unit suitable for generating the reference read level or the measurement read level based on a level control signal, and reading the data of the memory cells based on the reference read level or the measurement read level; and an interval selection unit suitable for searching the multiple stages of distribution values stored in the distribution table based on the difference value transferred from the memory controller, and selecting any one recovery read level interval corresponding to the searched result among the multiple stages of recovery read level intervals stored in the distribution table.

In an embodiment, the interval selection unit may compare sequentially the multiple stages of distribution values stored in the distribution table one by one with the difference value and, when a comparison result is changed from a one-stage smaller state to a one-stage larger state or from a one-stage larger state to a one-stage smaller state, selects any one distribution value corresponding to the one-stage larger state as the searched result.

In an embodiment, the interval selection unit may compare sequentially the multiple stages of distribution values stored in the distribution table one by one with the difference value and, when a comparison result is changed from a one-stage smaller state to a one-stage larger state or from a one-stage larger state to a one-stage smaller state, selects any one distribution value corresponding to the one-stage smaller state as the searched result.

In an embodiment, the memory controller may include: a signal generation unit suitable for generating the level control signal with a first value outside an error correcting operation mode such that the normal data is read from the read operation unit, and generating the level control signal with a second value during the error correcting operation mode such that the measurement data is read from the read operation unit; a counting unit suitable for counting the difference of the normal data and the measurement data during the error correcting operation mode to determine the difference value; and an error correcting operation unit suitable for detecting whether an error occurs in the normal data to determine when to enter the error correcting operation mode, and recovering, during the error correcting operation mode, the normal data in which an error occurs, based on the recovery read level interval selected by the interval selection unit.

In an embodiment, the memory controller may receive the recovery read level interval, as a read interval of a log likelihood ratio, performs a low density parity check for the normal data in which an error occurs, and recovers a value of the normal data.

In an embodiment, a nonvolatile memory system may include: a nonvolatile memory device including a plurality of memory cells; and a memory controller including a distribution table suitable for storing recovery read level intervals that are set by being changed through multiple stages according to a distribution value of threshold voltage levels of the memory cells, measured at a reference read level, is changed through the multiple stages, wherein, when an error occurs in normal data read from the memory cells by using the reference read level, the memory controller reads measurement data from the memory cells by additionally using a measurement, read level, searches for a difference value between the normal data and the measurement data from the multiple stages of distribution values stored in the distribution table, and recovers the normal data based on a recovery read level interval corresponding to the searched distribution value.

In an embodiment, after setting, in advance, cases where the distribution value of the threshold voltage levels of a plurality of memory cells, measured at the reference read level, is changed through the multiple stages through test operations to generate the multiple stages of distribution values, the recovery read level intervals predicted through the multiple stages are set according to distribution values measured in the respective cases and may be stored in the distribution table.

In an embodiment, in the each of the cases through the test operations, after reading data stored in the memory cells by respectively using the reference read level and the measurement read level, a difference between two read data values may be measured as any one distribution value among the multiple stages of distribution values.

In an embodiment, in the each of the cases through the test operations, a recovery read level interval with a relatively large level interval among the multiple stages of recovery read level intervals may be set in correspondence to a distribution value with a relatively large value among the multiple stages of distribution values, and a recovery read level interval with a relatively small level interval among the multiple stages of recovery read level intervals may be set in correspondence to a distribution value with a relatively small value among the multiple stages of distribution values.

In an embodiment, the nonvolatile memory device may further include: a read operation unit suitable for generating the reference read level or the measurement read level based on a level control signal, and reading the data of the memory cells based on the reference read level or the measurement read level.

In an embodiment, the memory controller may further include: a signal generation unit suitable for generating the level control signal with a first value outside an error correcting operation mode such that the normal data is read from the read operation unit, and generating the level control signal with a second value during the error correcting operation mode such that the measurement data is read from the read operation unit; a counting unit suitable for counting the difference of the normal data and the measurement data during the error correcting operation mode to determine the difference value; an interval selection unit suitable for searching the difference value from the multiple stages of distribution values stored in the distribution table, and selecting any one recovery read level interval corresponding to a search result among the multiple stages of recovery read level intervals stored in the distribution table; and an error correcting operation unit suitable for detecting whether an error occurs in the normal data and determining when to enter the error correcting operation mode, and recovering the normal data in which an error occurs, based on the recovery read level interval selected by the interval selection unit, during the error correcting operation mode.

In an embodiment, the interval selection unit may compare sequentially the multiple stages of distribution values stored in the distribution table one by one with the difference value and, when a comparison result is changed from a one-stage smaller state to a one-stage larger state or from a one-stage larger state to a one-stage smaller state, selects any one distribution value corresponding to the one-stage larger state as the searched result.

In an embodiment, the interval selection unit may compare sequentially the multiple stages of distribution values stored in the distribution table one by one with the difference value and, when a comparison result is changed from a one-stage smaller state to a one-stage larger state or from a one-stage larger state to a one-stage smaller state, selects any one distribution value corresponding to the one-stage smaller state as the searched result.

In an embodiment, the memory controller may receive the recovery read level interval, as a read interval of a log likelihood ratio, performs a low density parity check for the normal data in which an error occurs, and recovers a value of the normal data.

In an embodiment, a data recovery method of a nonvolatile memory system including a plurality of memory cells, the method may include: generating a distribution table, wherein the distribution table stores recovery read level intervals that are set by being changed through multiple stages according to a distribution value of threshold voltage levels of the memory cells, measured at a reference read level, is changed through the multiple stages; reading normal data from the memory cells by using the reference read level; reading measurement data from the memory cells by additionally using a measurement read level when an error occurs in the normal data; searching a difference value between the normal data and the measurement data from the multiple stages of distribution values stored in the distribution table; and recovering the normal data based on a recovery read level interval corresponding to the searched distribution value.

In an embodiment, the distribution table may be generated through test operations.

BRIEF DESCRIPTION OF THE DRAWINGS

FIGS. 4A to 4D are graphs for describing a low density parity check (LDPC) scheme used for an error correcting function in a nonvolatile memory system.

DETAILED DESCRIPTION

Figure 1:
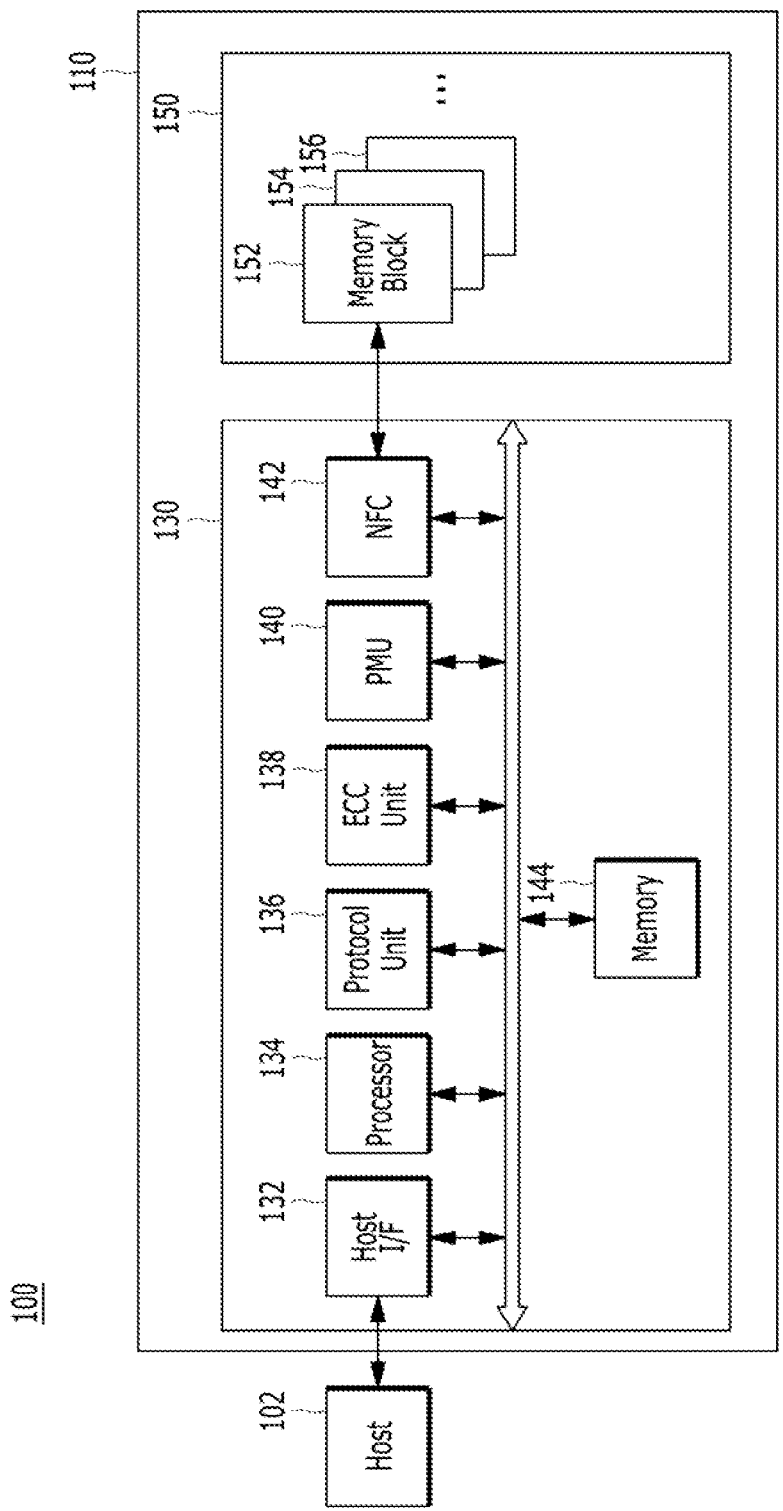
FIG. 1 is a diagram illustrating a data processing system including a memory system.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts in the various figures and embodiments of the present invention.

It is also noted that in this specification, "connected/coupled" refers to one component not only directly coupling another component, but also indirectly coupling another component through an intermediate component. In addition, a singular form may include a plural form as long as it is not specifically mentioned. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween. When a first layer is referred to as being "on" a second layer or "on" a substrate, it not only refers to where the first layer is formed directly on the second layer or the substrate but also where a third layer exists between the first layer and the second layer or the substrate.

FIG. 1 is a diagram illustrating a data processing system 100 including a memory system.

Referring to FIG. 1, the data processing system 100 may include a host 102 and a memory system 110.

The host 102 includes, for example, a portable electronic device such as a mobile phone, an MP3 player and a laptop computer or an electronic device such as a desktop computer, a game player, a TV and a projector.

The memory system 110 operates in response to a request from the host 102 and, in particular, stores data to be accessed by the host 102. In other words, the memory system 110 may be used as a main memory or an auxiliary memory of the host 102. The memory system 110 may be realized as any one of various kinds of storage devices, according to the protocol of a host interface to be electrically coupled with the host 102. For example, the memory system 110 may be realized as any one of various kinds of storage devices such as a solid-state drive (SSD), a multimedia card in the form of an MMC, an eMMC (embedded MMC), an RS-MMC (reduced size MMC) and a micro-MMC, a secure digital card in the form of an SD, a mini-SD and a micro-SD, a universal serial bus (USB) storage device, a universal flash storage (UFS) device, a compact flash (CF) card, a smart media card, a memory stick, and so forth.

The storage devices forming the memory system 110 may be realized as a volatile memory device such as a dynamic random access memory (DRAM) and a static random access memory (SRAM) or a nonvolatile memory device such as a read only memory (ROM), a mask ROM (MROM), a programmable ROM (PROM), an erasable programmable ROM (EPROM), an electrically erasable programmable ROM (EEPROM), an ferroelectric random access memory (FRAM), a phase change RAM (PRAM), a magnetic RAM (MRAM) and a resistive RAM (RRAM).

The memory system 110 includes a memory device 150. The memory device 150 stores data to be accessed by the host 102, and a controller 130 which controls the memory device 150 to store data.

The controller 130 and the memory device 150 may be integrated into one semiconductor device. For instance, the controller 130 and the memory device 150 may be integrated into one semiconductor device to form an SSD. When the memory system 110 is used as the SSD, the operation speed of the host 102, which is electrically coupled with the memory system 110, may be significantly increased.

The controller 130 and the memory device 150 may be integrated into one semiconductor device to form a memory card. For example, the controller 130 and the memory card 150 may be integrated into one semiconductor device to form a memory card such as a personal computer memory card international association (PCMCIA) card, a compact flash (CF) card, a smart media card in the form of an SM and an SMC, a memory stick, a multimedia card in the form of an MMC, an RS-MMC and a micro-MMC, a secure digital card in the form of an SD, a mini-SD, a micro-SD and an SDHC, and a universal flash storage (UFS) device.

Furthermore, the memory system 110 may form a computer, an ultra mobile PC (UMPC), a workstation, a net-book, a personal digital assistant (PDA), a portable computer, a web tablet, a tablet computer, a wireless phone, a mobile phone, a smart phone, an e-book, a portable multi-media player (PMP), a portable game player, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage for a data center, a device capable of transmitting and receiving information under a wireless environment, one of various electronic devices for a home network, one of various electronic devices for a computer network, one of various electronic devices for a telematics network, an RFID device, or one of various component elements for a computing system.

The memory device 150 may retain stored data even when power is blocked, store the data provided from the host 102, through a write operation, and provide stored data to the host 102, through a read operation. The memory device 150 may include a plurality of memory blocks 152, 154 and 156. Each of the memory blocks 152, 154 and 156 includes a plurality of pages. Each of the pages includes a plurality of memory cells to which a plurality of word lines (WL) are electrically coupled. The memory device 150 may be a nonvolatile memory device, for example, a flash memory. The flash memory may have a 3D stack structure.

The controller 130 of the memory system 110 controls the memory device 150 in response to a request from the host 102. For example, the controller 130 provides the data read from the memory device 150, to the host 102, and stores the data provided from the host 102, in the memory device 150. To this end, the controller 130 controls the operations of the memory device 150, such as read, write, program and erase operations.

In detail, the controller 130 may include a host interface (I/F) 132, a processor 134, a protocol unit 136, an error correction code (ECC) unit 138, a power management unit (PMU) 140, a NAND flash controller (NFC) 142, and a memory 144.

The host interface unit 132 processes the commands and data of the host 102, and may communicate with the host 102 through at least one of various interface protocols such as a universal serial bus (USB), a multimedia card (MMC), a peripheral component interconnect-express (PCI-E), a serial attached SCSI (SAS), a serial advanced technology attachment (SATA), a parallel advanced technology attachment (PATA), a small computer system interface (SCSI), an enhanced small disk interface (ESDI), and integrated drive electronics (IDE).

The ECC unit 138 detects and corrects an error included in the data read from the memory device 150 when reading the data stored in the memory device 150. That is to say, after performing error correction decoding for the data read from the memory device 150, the ECC unit 138 may determine whether the error correction decoding has succeeded, output an indication signal according to a determination result, and correct an error bit of the read data by using the parity bit generated in an ECC encoding process. The ECC unit 138 may not correct error bits if error bits occur by a number equal to or greater than a threshold number of correctable error bits, and may output an error correction fail signal corresponding to incapability of correcting error bits.

The ECC unit 138 may perform error correction by using a low density parity check (LDPC) code, a Bose, Chaudhuri, and Hocquenghem (BCH) code, a turbo code, a Reed-Solomon code, a convolution code, a recursive systematic code (RSC), a trellis-coded modulation (TCM) or a block coded modulation (BCM). The ECC unit 138 may include all circuits, systems or devices for error correction.

The protocol unit 136 stores and manages protocols for the controller 130 to control the memory device 150 in response to a request from the host 102. The PMU 140 provides and manages power for the controller 130, that is, power for the component elements included in the controller 130.

The NFC 142, as a memory interface which performs interfacing between the controller 130 and the memory device 150 to allow the controller 130 to control the memory device 150 in response to a request from the host 102, generates control signals for the memory device 150 and processes data according to the control of the processor 134, where the memory device 150 is a flash memory (e.g., a NAND flash memory).

The memory 144, as the working memory of the memory system 110 and the controller 130, stores data for driving of the memory system 110 and the controller 130. Specifically, when the controller 130 controls the memory device 150 in response to a request from the host 102. For example, when the controller 130 provides the data read from the memory device 150 to the host 102, and stores the data provided from the host 102, in the memory device 150, and, to this end, when the controller 130 controls the operations of the memory device 150, such as read, write, program and erase operations, the memory 144 stores data needed to allow such operations to be performed between the controller 130 and the memory device 150.

The memory 144 may be formed of a volatile memory such as a static random access memory (SRAM) or a dynamic random access memory (DRAM). As described above, the memory 144 stores data needed to perform data read and write operations between the host 102 and the memory device 150, and data with which the data read and write operations are performed. For such storage of data, the memory 144 may include a program memory, a data memory, a write buffer, a read buffer, a map buffer, and so forth.

The processor 134 controls the general operations of the memory system 110, and controls a write operation or a read operation for the memory device 150, in response to a write request or a read request from the host 102. The processor 134 drives firmware which is referred to as a flash translation layer (FTL), to control the general operations of the memory system 110. The processor 134 may be formed of a microprocessor or a central processing unit (CPU).

Figure 2:
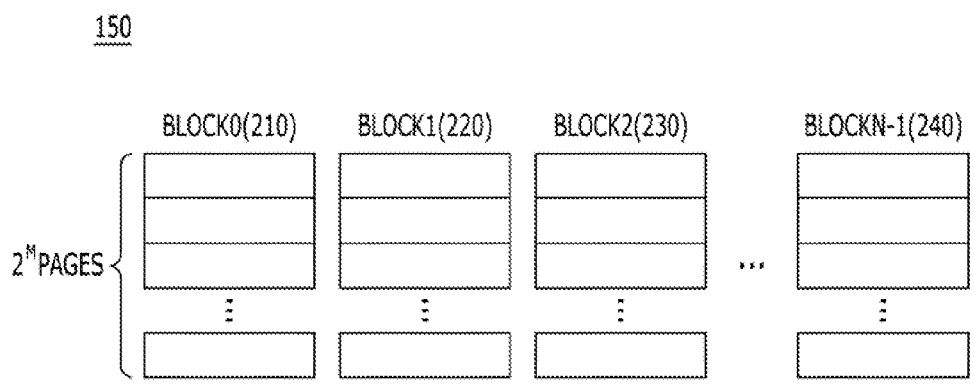
FIG. 2 is a detailed diagram of a memory device in the memory system shown in FIG. 1.

FIG. 2 is a detailed diagram of the memory device 150 shown in FIG. 1.

Referring to FIG. 2, the memory device 150 includes a plurality of memory blocks, for example, a zeroth block (BLOCK0) 210, a first block (BLOCK1) 220, a second block (BLOCK2) 230 and an N-1$^{th}$ block (BLOCKN-1) 240. Each of the blocks 210, 220, 230 and 240 includes a plurality of pages, for example, $2^M$ number of pages ($2^M$PAGES). While it is described for the sake of convenience that each of the memory blocks includes $2^M$ number of pages, it is to be noted that each of the memory blocks may include M number of pages. Each of the pages includes a plurality of memory cells to which a plurality of word lines are electrically coupled.

Each of the memory blocks 210, 220, 230 and 240 stores the data provided from the host device 102 through a write operation, and provides the stored data to the host 102 through a read operation.

Figure 3:
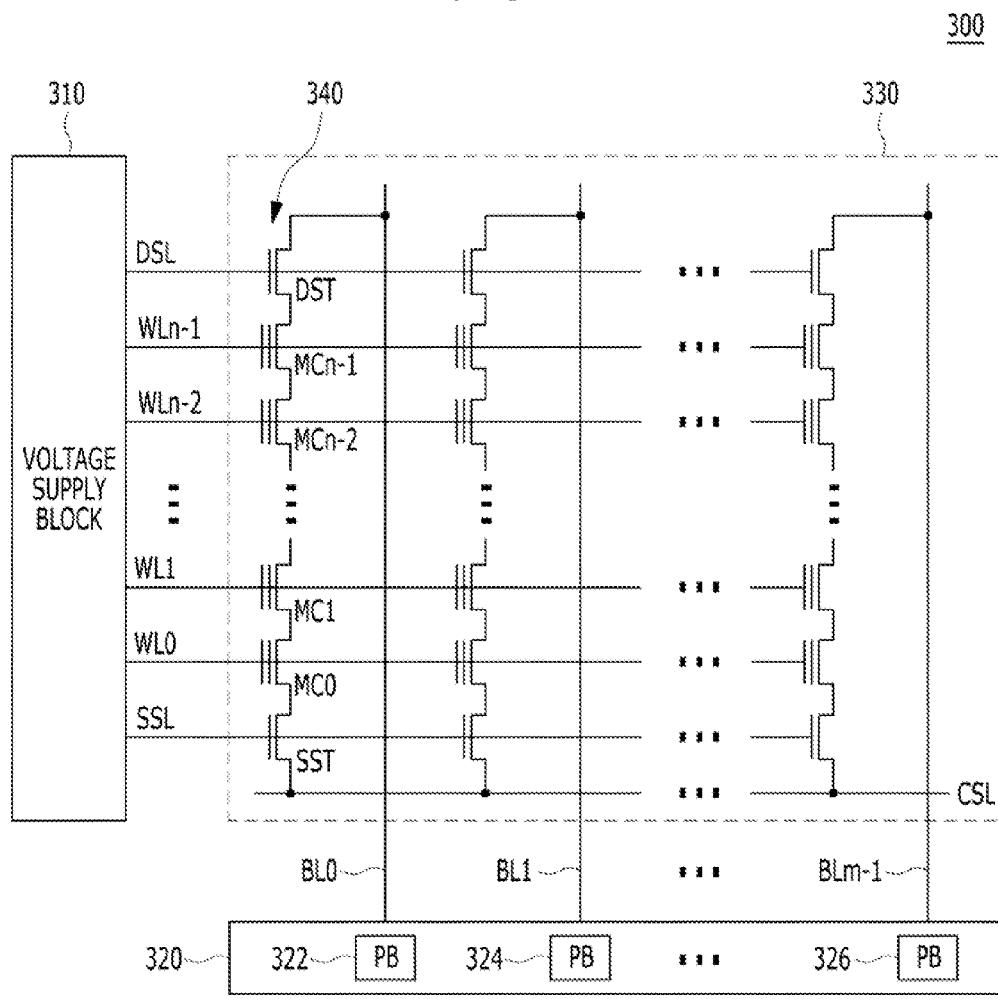
FIG. 3 is a detailed diagram of a memory device including a memory block shown in FIG. 2.

FIG. 3 is a detailed diagram of a memory device 300 including the memory block shown in FIG. 2. FIG. 3 shows a memory cell array circuit of the memory device 300.

Referring to FIG. 3, in the memory system 110, a memory block 330 of the memory device 300 may include a plurality of cell strings 340 which are electrically coupled to bit lines BL0 to BLm-1, respectively. The cell string 340 of each column may include at least one drain select transistor DST and at least one source select transistor SST. A plurality of memory cell transistors MC0 to MCn-1 may be electrically coupled in series between the select transistors DST and SST. The respective memory cells MC0 to MCn-1 may be configured by multi-level cells (MLC), each of which stores data information of a plurality of bits. The strings 340 may be electrically coupled to corresponding bit lines BL0 to BLm-1, respectively.

For reference, in each of the memory cells MC0 to MCn-1, single bit data may be stored, or multi-bit data of 2 or more bits may be stored. A single level cell (SLC) type nonvolatile memory device, which stores single bit data, has an erased state and a programmed state according to a threshold voltage distribution. A multi-level cell (MLC) type nonvolatile memory device, which stores multi-bit data, has one erased state and a plurality of programmed states according to a threshold voltage distribution. In FIG. 3, 'DSL' denotes a drain select line, 'SSL' denotes a source select line, and 'CSL' denotes a common source line.

While FIG. 3 shows, as an example, the memory block 330 which is formed of NAND flash memory cells, it is to be noted that the memory block 330 of the memory device 300 may be formed of a NOR flash memory, a hybrid flash memory including at least two kinds of memory cells that are combined, or a One-NAND flash memory including a controller built in a memory chip. The operational characteristics of a semiconductor device may be applied to not only a flash memory device in which a charge storing layer is configured by conductive floating gates but also a charge trap flash (CTF) in which a charge storing layer is configured by a dielectric layer.

A voltage supply block 310 of the memory device 300 may provide word line voltages, for example, a program voltage, a read voltage and a pass voltage, to be supplied to respective word lines according to an operation mode and voltages to be supplied to bulks, for example, well regions, where memory cells are formed. The voltage generating operation of the voltage supply block 310 may be performed by the control of a control circuit (not shown). The voltage supply block 310 may generate a plurality of variable read voltages to generate a plurality of read data, select one of the memory blocks (or sectors) of a memory cell array under the control of the control circuit, select one of the word lines of the selected memory block, and provide the word line voltages to the selected word line and unselected word lines.

A read/write circuit 320 of the memory device 300 is controlled by the control circuit, and may operate as a sense amplifier or a write driver according to an operation mode. For example, in a verification/normal read operation, the read/write circuit 320 may operate as a sense amplifier for reading data from the memory cell array. Also, in a program operation, the read/write circuit 320 may operate as a write driver which drives bit lines according to data to be stored in the memory cell array. The read/write circuit 320 may receive data to be written in the memory cell array, from a buffer (not shown), in a program operation, and may drive the bit lines according to the inputted data. To this end, the read/write circuit 320 may include a plurality of page buffers (PBs) 322, 324 and 326 respectively corresponding to columns (or bit lines) or pairs of columns (or pairs of bit lines), and a plurality of latches (not shown) may be included in each of the page buffers 322, 324 and 326.

FIGS. 4A to 4D are graphs for describing a low density parity check (LDPC) scheme used for an error correcting function in a nonvolatile memory system.

Figure 4A:
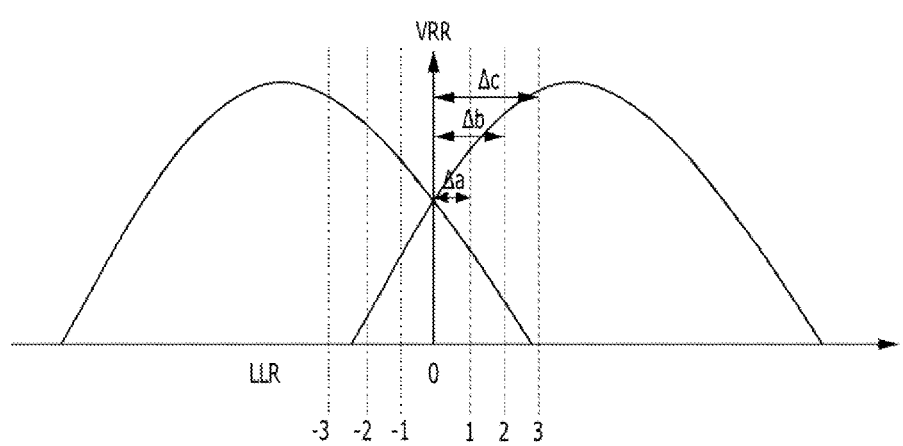

Referring to FIG. 4A, in an LDPC scheme used for an error correcting function in a nonvolatile memory system, a plurality of memory cells are respectively read using close read levels $-1/1$, $-2/2$ and $-3/3$ that have predetermined intervals $\Delta a$, $\Delta b$ and $\Delta c$ with a reference read level VRR serving as a center, and a log likelihood ratio (LLR) value is set by referring to variations in the number of data with the value of '1' or the number of data with the value of '0' in the respective read operations.

The LLR value determined in this way exerts a significant influence on the error correction capability of the LDPC scheme. This is because, as shown in FIGS. 4B and 4C, the probabilities of undesired data to be read, that is, error rates E1 and E2, when reading data at a reference read level VRR, may vary significantly according to the threshold voltage level distribution of memory cells.

Figure 4B:
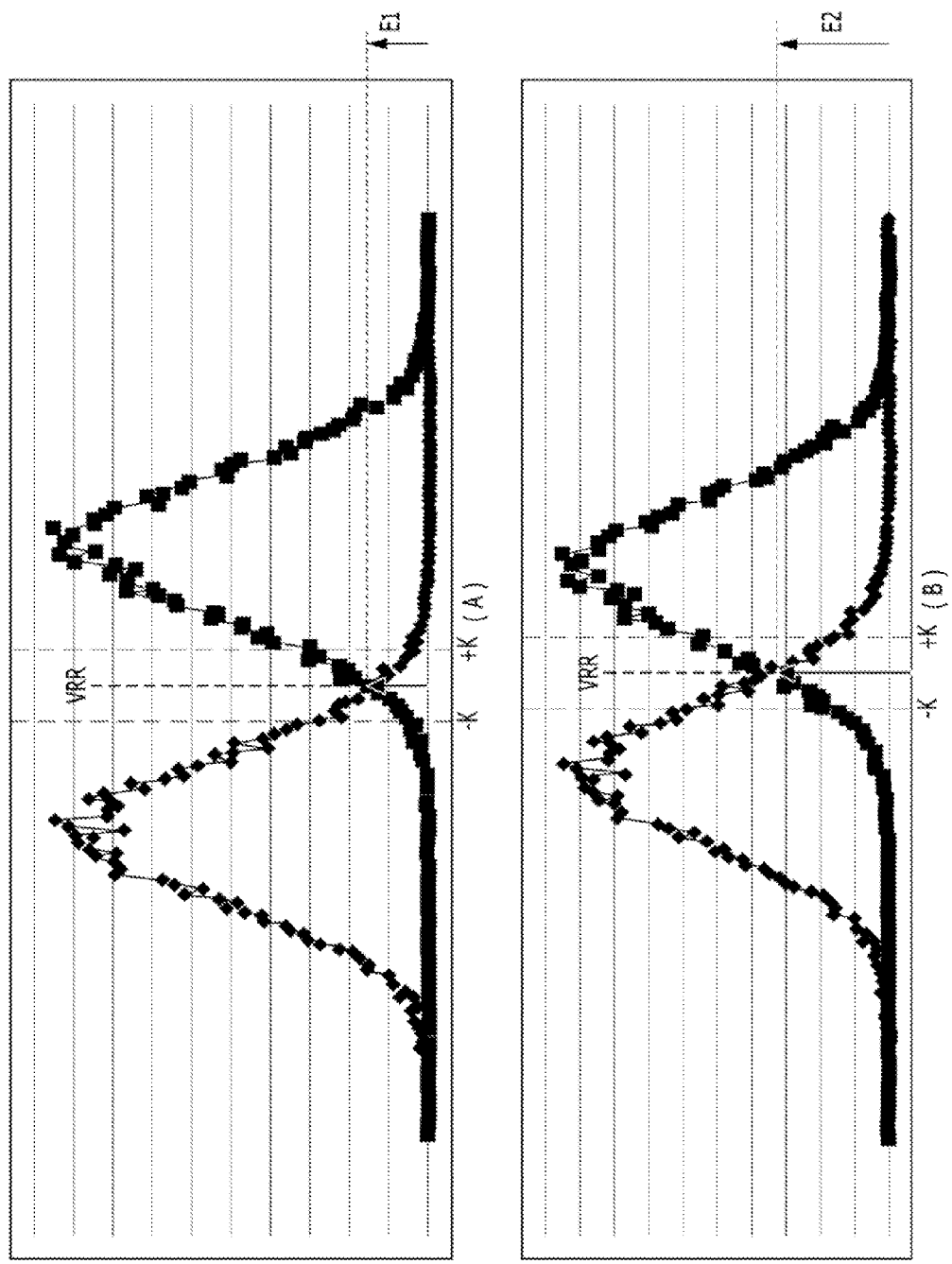

In detail, referring to FIG. 4B, it may be seen that two graphs (A) and (B) have a significant difference in terms of the number of memory cells with threshold voltage levels that are substantially close to the reference read level VRR, that is, the number of memory cells with data values read at the reference read level VRR that are unclear as to which values they will have.

First, in the graph (A) where the number of memory cells, of which threshold voltage levels are substantially close to the reference read level VRR, is relatively small, the error rate E1 is relatively small. That is to say, when counting the number of memory cells of which threshold voltage levels are within a predetermined level interval between levels VRR+K and VRR−K close to the reference read level VRR, the number is relatively small.

Conversely, in the graph (B) where the number of memory cells, of which threshold voltage levels are substantially close to the reference read level VRR, is relatively large, the error rate E2 is relatively large. That is to say, when counting the number of memory cells of which threshold voltage levels are within the predetermined level interval between the levels VRR+K and VRR−K close to the reference read level VRR, the number is relatively large.

Referring to FIG. 4C, it may be seen that, in order for an error correcting operation to be effectively performed in the LDPC scheme, a read interval DELTA for generating an optimized LLR value should be determined according to a value SIGMA that corresponds to a threshold voltage level distribution of a plurality of memory cells based on a Gaussian model.

Therefore, if a value SIGMA corresponding to a threshold voltage level distribution of a plurality of memory cells is relatively small, that is, if the threshold voltage levels of the memory cells are distributed within a relatively small range, the error correcting operation performed in the LDPC scheme may be sufficient, even when a read interval DELTA for generating an LLR value is relatively small (see the reference symbol LLR1).

Conversely, if a value SIGMA corresponding to a threshold voltage level distribution of a plurality of memory cells is relatively large, that is, if the threshold voltage levels of the memory cells are distributed within a relatively large range, the error correcting operation performed in the LDPC scheme may be sufficient, only when a read interval DELTA for generating an LLR value is relatively large (see the reference symbol LLR2).

That is, in order to efficiently perform an error correcting operation using the LDPC scheme, an operation of determining a read Interval DELTA for generating an LLR value with respect to the reference read level VRR is important. That is, a value SIGMA corresponding to a threshold voltage level distribution of a plurality of memory cells may be a factor that determines a read interval DELTA for generating an LLR value. However, in a general nonvolatile memory device, a threshold voltage level distribution of a plurality of memory cells may be changed by an operation of applying a stress to the memory cells, for example, an operation of repeating read/program cycles, read disturbance between adjacent memory cells during a read operation, a retention program, etc.

Figure 5:
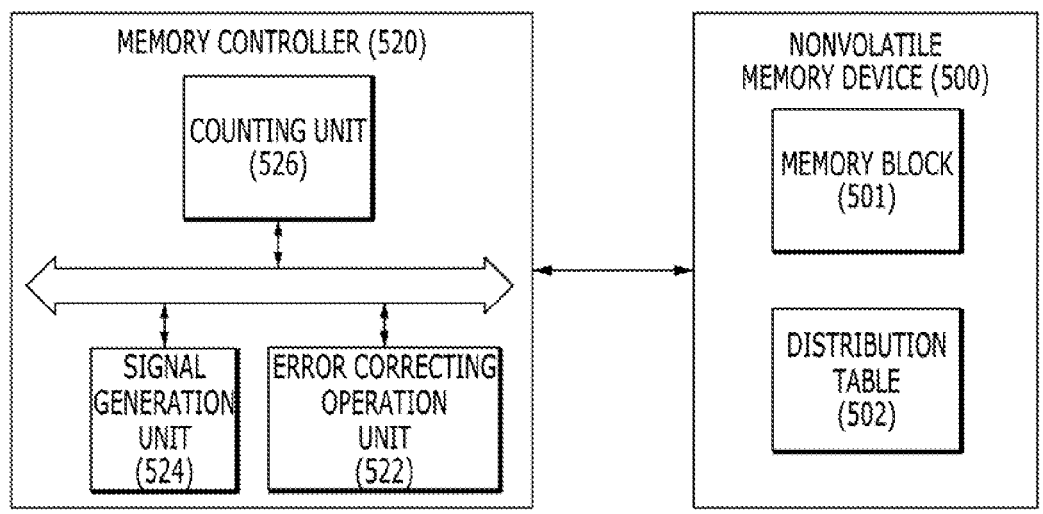
FIG. 5 is a block diagram illustrating a nonvolatile memory system in accordance with an embodiment of the present invention.

FIG. 5 is a block diagram illustrating a nonvolatile memory system in accordance with an embodiment of the present invention. FIG. 5 shows configurations of a memory controller 520 and a nonvolatile memory device 500 which are based on the configuration of the memory system shown in FIG. 1.

Referring to FIG. 5, the nonvolatile memory system includes the nonvolatile memory device 500 and the memory controller 520.

The nonvolatile memory device 500 may include a memory block 501 and a distribution table 502. The memory block 501 may have the same configuration as the memory block 330 shown in FIG. 3. Accordingly, a plurality of memory cells are included in the memory block 501. The distribution table 502 stores recovery read level intervals set by being changed through M stages according to the distribution value of the threshold voltage levels of a plurality of memory cells, measured at a reference read level, is changed through M stages.

Further, the memory controller 520 may include an error correcting operation unit 522, a signal generation unit 524 and a counting unit 526. The error correcting operation unit 522 may quickly find an LLR value that exerts a significant influence on the performance of an LDPC scheme, from the distribution table 502 included in the nonvolatile memory device 500, when performing an error correcting function by using the LDPC scheme. By the error correcting operation unit 522, the error correcting function may be performed quickly and effectively.

The distribution table 502 is a component element which is not illustrated in FIG. 1 and should added to the nonvolatile memory device 500 for an embodiment of the present invention. The error correcting operation unit 522 may be functionally added to the ECC unit 138 illustrated in FIG. 1. Also, the counting unit 526 and the signal generation unit 524 are additionally included in the memory controller 520 to support the operation of the error correcting operation unit 522. The counting unit 526 and the signal generation unit 524 may be functionally added to the processor 134 illustrated in FIG. 1.

Figure 6:
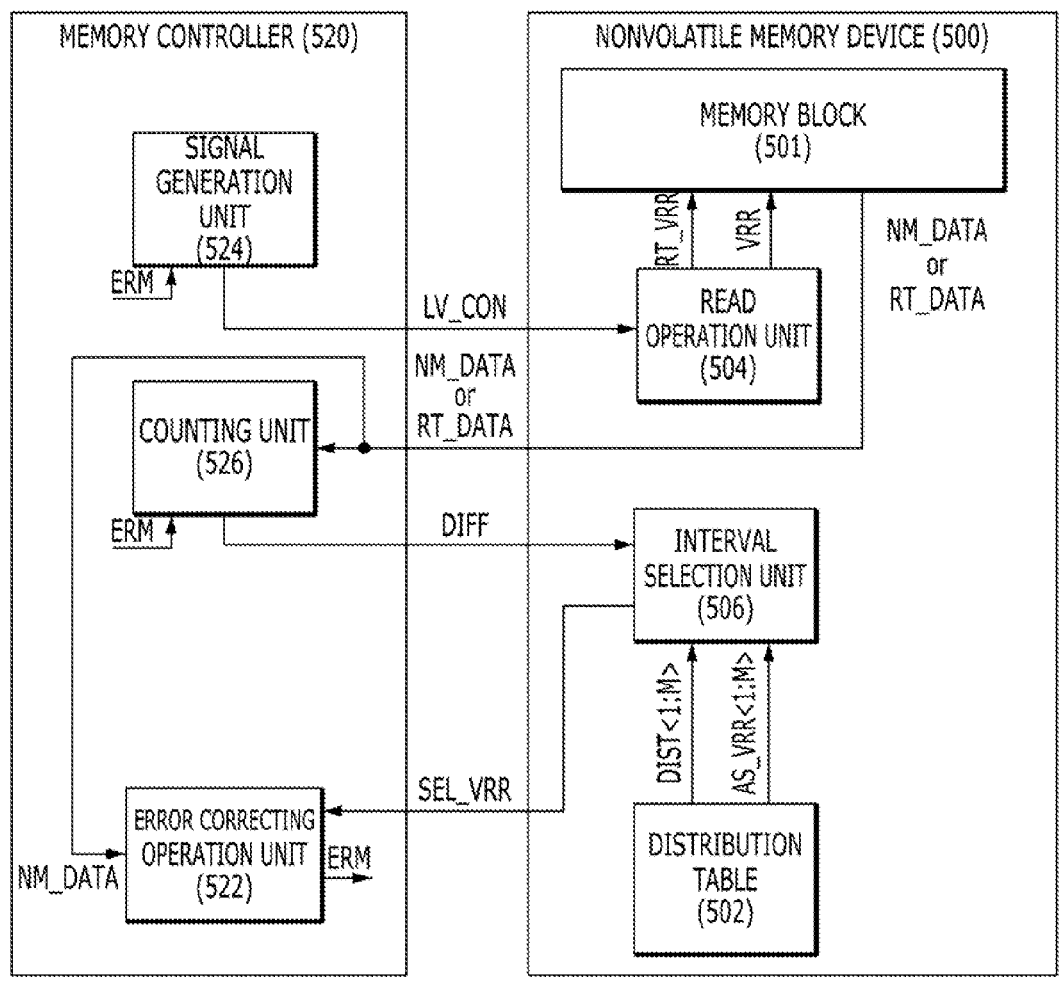
FIG. 6 is a detailed diagram of the nonvolatile memory system shown in FIG. 5.

FIG. 6 is a detailed diagram of the nonvolatile memory system shown in FIG. 5.

Referring to FIG. 6, the nonvolatile memory device 500 may include the memory block 501, the distribution table 502, a read operation unit 504, and an interval selection unit 506. Further, the memory controller 520 may include the signal generation unit 524, the counting unit 526, and the error correcting operation unit 522 as shown in FIG. 5.

The data stored in the memory cells included in the memory block 501 may be read as normal data NM_DATA by using a reference read level VRR which is supplied from the read operation unit 504.

When entering an error correcting operation mode ERM as an error occurred in the normal data NM_DATA may not be recovered by the operation of the error correcting operation unit 522, the data stored in the memory cells included in the memory block 501 may be read again as measurement data RT_DATA by using a measurement read level RT_VRR which is supplied from the read operation unit 504.

The nonvolatile memory device 500 receives a difference value DIFF from the memory controller 520, searches M stages of distribution values DIST<1:M> stored in the distribution table 502 based on the difference value DIFF, and selects any one recovery read level interval SEL_VRR among M stages of recovery read level intervals AS_VRR<1:M> which correspond to the M stages of distribution values DIST<1:M>.

In detail, the recovery read level intervals AS_VRR<1:M> which are set by being changed through M stages according to a distribution value DIST of the threshold voltage levels of the memory cells, measured at the reference read level VRR, is changed through M stages to generate the M stages of distribution values DIST<1:M>, and are stored in the distribution table 502. In other words, the M stages of distribution values DIST<1:M> and the M stages of recovery read level intervals AS_VRR<1:M> are stored in the distribution table 502 in the form a table in which they are matched in one-to-one correspondence.

The reason why the distribution value DIST of the threshold voltage levels of the memory cells stored in the distribution table 502 is changed through M stages to generate the M stages of distribution values DIST<1:M> is because the nonvolatile memory device 500 including the memory cells may be influenced by PVT (i.e., a process, a voltage and a temperature) variations. For example, referring to FIG. 4D, if the nonvolatile memory device 500 including the memory cells operates in a relatively bad environment, the distribution value DIST for the memory cells that is measured at the reference read level VRR may be 150 a relatively high value. Conversely, if the nonvolatile memory device 500 including the memory cells operates under a relatively good environment, the distribution value DIST for the memory cells that is measured at the reference read level VRR may be 50 a relatively low value.

As the distribution value DIST of the threshold voltage levels of the memory cells is changed through M stages to generate the M stages of distribution values DIST<1:M>, a recovery read level interval AS_VRR is also changed through M stages to generate the M stages of recovery read level intervals AS_VRR<1:M>. This is because a change in the distribution value DIST of the threshold voltage levels of the memory cells, measured at the reference read level VRR, means a change in the number of memory cells which have threshold voltage levels close to the reference read level VRR. For example, referring to FIG. 4D, where the distribution value DIST of the threshold voltage levels of the memory cells, measured at the reference read level VRR, is 150 a relatively high value, the recovery read level interval AS_VRR that is measured as 'LV2' is relatively wide. Conversely, where the distribution value DIST of the threshold voltage levels of the memory cells, measured at the reference read level VRR, is 50 as a relatively low value, the recovery read level interval AS_VRR is measured as 'LV1' and is relatively narrow. For reference, the symbol M means a natural number equal to or larger than 2. Namely, the fact that each of the distribution value DIST and the recovery read level interval AS_VRR is changed through M stages means that each of the distribution value DIST and the recovery read level Interval AS_VRR is changed through at least two stages.

Meanwhile, it is to be noted that the distribution value DIST of the threshold voltage levels of the memory cells included in one nonvolatile memory device is one. Therefore, it is impossible for the distribution value DIST of the threshold voltage levels of the memory cells included in one nonvolatile memory device to be changed simultaneously through at least two stages. That is to say, in order to measure, at once, the distribution values DIST of the threshold voltage levels of the memory cells at the reference read level VRR that are changed through M stages to generate the M stages of distribution values DIST<1:M>, as included in the distribution table 502, results with different values should be acquired when the distribution values DIST of the threshold voltage levels of the pluralities of memory cells included in M number of nonvolatile memory devices are measured at the reference read level VRR. Thus, in order to figure out that the recovery read level interval AS_VRR will have which values to generate the M stages of recovery read level intervals AS_VRR<1:M>, in correspondence to the distribution value DIST of the threshold voltage levels of the memory cells measured at the reference read level VRR that is changed through M stages to generate the M stages of distribution values DIST<1:M>, a number of test operations should be performed in advance for a number of nonvolatile memory devices.

Hence, in the embodiment of the present invention, test operations are performed to allow the distribution values DIST of the threshold voltage levels of the memory cells that are stored in the distribution table 502, to be generated as the M stages of distribution values DIST<1:M>. In detail, while not directly shown in FIGS. 5 and 6, a scheme may be used wherein, after setting in advance, where the distribution value DIST of the threshold voltage levels of a plurality of memory cells, measured at the reference read level VRR, is changed through M stages through test operations to generate the M stages of distribution values DIST<1:M>, by causing a plurality of nonvolatile memory devices each including a plurality of memory cells, in which the nonvolatile memory device 500 shown in FIGS. 5 and 6 is not included, to be placed under the influence of a PVT environment that varies in a variety of ways, the recovery read level intervals AS_VRR<1:M> predicted through M stages are set according to the distribution values DIST<1:M> measured in the respective cases and are stored in the distribution table 502.

Figure 4D:
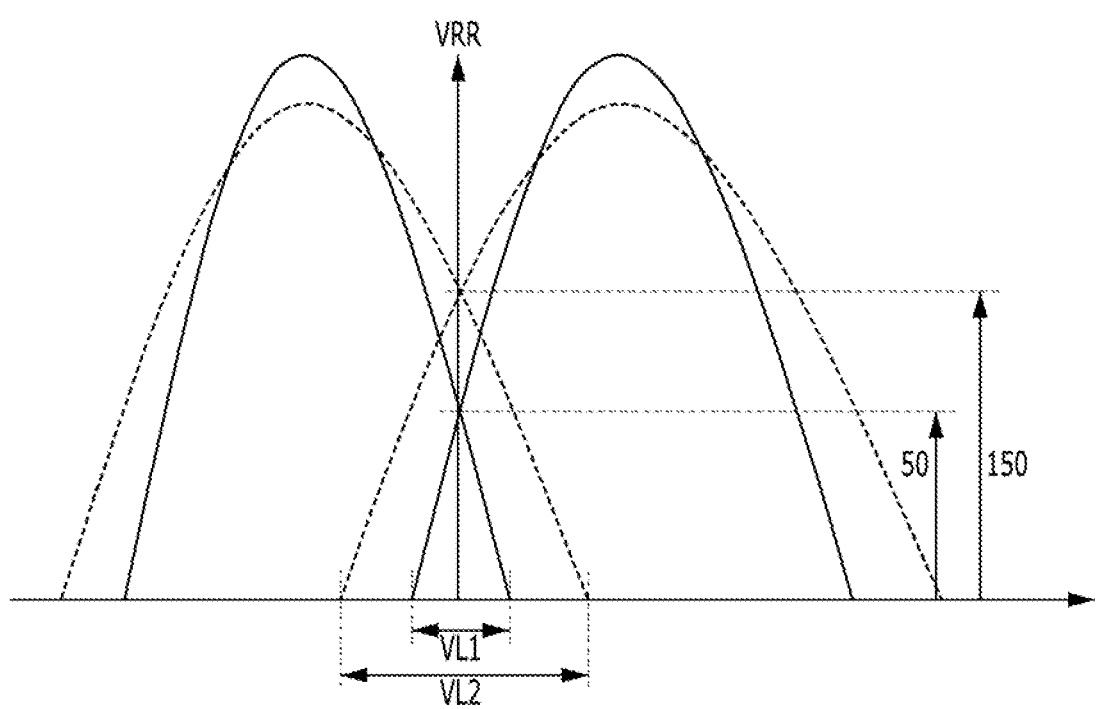

The M stages of distribution values DIST<1:M> and the M stages of recovery read level intervals AS_VRR<1:M> that may be measured through a plurality of test operations for the nonvolatile memory devices, in which the nonvolatile memory device 500 shown in FIGS. 5 and 6 is not included, may generally have the form as shown in FIG. 4D. In other words, a recovery read level interval AS_VRR with a relatively large level interval among the M stages of recovery read level intervals AS_VRR<1:M> may be set in correspondence to a distribution value DIST with a relatively large value among the M stages of distribution values DIST<1:M>, and a recovery read level interval AS_VRR with a relatively small level interval among the M stages of recovery read level Intervals AS_VRR<1:M> may be set in correspondence to a distribution value DIST with a relatively small value among the M stages of distribution values DIST<1:M>. The values the M stages of distribution values DIST<1:M> and the M stages of recovery read level intervals AS_VRR<1:M> will have may change depending on the characteristics of the nonvolatile memory devices used in the test operations, in which the nonvolatile memory device 500 shown in FIGS. 5 and 6 is not included. This is a matter to be controlled by a designer.

In the operation of measuring the distribution value DIST of the threshold voltage levels of the memory cells included in one nonvolatile memory device by using the reference read level VRR, not only the reference read level VRR but also the measurement read level RT_VRR having a level substantially close to the reference read level VRR are used. Namely, after reading the data stored in the memory cells included in one nonvolatile memory device by respectively using the reference read level VRR and the measurement read level RT_VRR, the difference between two read data values is the distribution value DIST of the threshold voltage levels of the memory cells included in one nonvolatile memory device. That is to say, when assuming that the number '1' among the values acquired by reading the data stored in the memory cells included in one nonvolatile memory device by using the reference read level VRR is 'K' and the number '1' among the values acquired by reading the data stored in the memory cells included in one nonvolatile memory device by using the measurement read level RT_VRR is 'L', the difference 'K–L' is the distribution value DIST of the threshold voltage levels of the memory cells included in one nonvolatile memory device. Therefore, the M stages of distribution values DIST<1:M> may be acquired through a process of repeating an operation of reading the data of the memory cells included in one nonvolatile memory device by respectively using the reference read level VRR and the measurement read level RT_VRR each time one test operation is performed and then determining the difference between the values of two read data, as any one distribution value DIST among the M stages of distribution values DIST<1:M>. For reference, which levels the reference read level VRR and the measurement read level RT_VRR will have may be controlled in a variety of ways according to the characteristics of a nonvolatile memory device used in a measuring operation. Accordingly, which levels the reference read level VRR and the measurement read level RT_VRR will have may be controlled in a variety of ways by a designer.

The read operation unit 504 generates the reference read level VRR or the measurement read level RT_VRR in response to a level control signal LV_CON, which is transferred from the memory controller 520, and allows the data of the memory cells included in the memory block 501 to be read, as the normal data NM_DATA or the measurement data RT_DATA, based thereon. That is to say, the read operation unit 504 generates the reference read level VRR in response to the value of the level control signal LV_CON corresponding to the period outside the error correcting operation mode ERM, and allows the data of the memory cells included in the memory block 501 to be read, as the normal data NM_DATA, based on the generated reference read level VRR. Further, the read operation unit 504 generates the measurement read level RT_VRR in response to the value of the level control signal LV_CON corresponding to the entry period of the error correcting operation mode ERM, and allows the data of the memory cells included in the memory block 501 to be read, as the measurement data RT_DATA, based on the generated measurement read level RT_VRR. The level control signal LV_CON corresponding to the period outside the error correcting operation mode ERM may have a logic high level, and the level control signal LV_CON corresponding to the entry period of the error correcting operation mode ERM may have a logic low level.

The interval selection unit 506 receives the difference value DIFF from the memory controller 520, searches the M stages of distribution values DIST<1:M> stored in the distribution table 502 based on the difference value DIFF, and selects any one recovery read level interval SEL_VRR among the M stages of recovery read level intervals AS_VRR<1:M> according to the searched result. The Interval selection unit 506 selects any one distribution value DIST among the M stages of distribution values DIST<1:M> stored in the distribution table 502, that is close to the difference value DIFF. For example, the interval selection unit 506 may compare sequentially the M stages of distribution values DIST<1:M> one by one with the difference value DIFF. When a comparison result is changed from a one-stage smaller state to a one-stage larger state or from a one-stage larger state to a one-stage smaller state, any one distribution value DIST corresponding to the one-stage larger state may be selected. Conversely, the interval selection unit 506 may compare sequentially the M stages of distribution values DIST<1:M> one by one with the difference value DIFF. When a comparison result is changed from a one-stage smaller state to a one-stage larger state or from a one-stage larger state to a one-stage smaller state, any one distribution value DIST corresponding to the one-stage smaller state may be selected.

The memory controller 520 reads the data stored in the memory block 501 of the nonvolatile memory device 500 as the normal data NM_DATA, outside the error correcting operation mode ERM, and checks whether an error occurs in the read normal data NM_DATA.

Even when an error occurs in the normal data NM_DATA, the memory controller 520 recovers data without entering the error correcting operation mode ERM if the error correcting operation unit 522 may correct the error by itself. However, if the error correcting operation unit 522 may not correct the error occurred in the read normal data NM_DATA by itself, the memory controller 520 enters the error correcting operation mode ERM, reads again the data stored in the memory block 501 of the nonvolatile memory device 500, as the measurement data RT_DATA, and generates the difference value DIFF by counting a value difference from the normal data NM_DATA in which the error occurs. The difference value DIFF generated in this way is transferred to the nonvolatile memory device 500, and is used in selecting a recovery read level interval SEL_VRR optimized to recover the normal data NM_DATA in which the error occurs. The recovery read level interval SEL_VRR selected in the distribution table 502 is transferred to the error correcting operation unit 522, and is used in recovering the normal data NM_DATA in which the error occurs.

In detail, the signal generation unit 524 generates the level control signal LV_CON with a first value outside the error correcting operation mode ERM such that the normal data NM_DATA is read from the read operation unit 504, and generates the level control signal LV_CON with a second value during the error correcting operation mode ERM such that the measurement data RT_DATA is read from the read operation unit 504. In other words, the signal generation unit 524 serves to control the value of the level control signal LV_CON and determine which read voltage is to be used when reading data from the memory block 501. The first value of the level control signal LV_CON for reading the normal data NM_DATA may be a logic high level, and the second value of the level control signal LV_CON for reading the measurement data RT_DATA may be a logic low level.

The counting unit 526 counts the difference of the normal data NM_DATA and the measurement data RT_DATA during the error correcting operation mode ERM, and determines the difference value DIFF. For example, when assuming that the number '1' among the values of the normal data NM_DATA is 'K' and the number '1' among the values of the measurement data RT_DATA is 'L', the counting unit 526 determines the difference 'K−L' as the difference value DIFF. It may be seen that the operation of the counting unit 526 is the same as the method used in the distribution table 502 to determine the M stages of distribution values DIST<1:M>. Namely, the difference value DIFF generated in the counting unit 526 may actually represent the distribution value of the threshold voltage levels of the memory cells included in the nonvolatile memory device 500. Accordingly, it may be possible to find a recovery read level Interval SEL_VRR optimally corresponding to the distribution value of the threshold voltage levels of the memory cells included in the nonvolatile memory device 500, through the operations of the above-described interval selection unit 506 to search the M stages of distribution values DIST<1:M> stored in the distribution table 502 based on the difference value DIFF and select an optimized recovery read level interval SEL_VRR.

The error correcting operation unit 522 detects whether an error occurs in the normal data NM_DATA and determines whether to enter the error correcting operation mode ERM, outside the error correcting operation mode ERM. In detail, the error correcting operation unit 522 performs an operation of detecting whether an error occurs in the normal data NM_DATA read from the nonvolatile memory device 500 outside the error correcting operation mode ERM. When an error occurs, the error correcting operation unit 522 enters the error correcting operation mode ERM, and when an error has not occurred, the error correcting operation unit 522 continuously retains the state exited from the error correcting operation mode ERM. A reference for determining that an error occurs in the normal data NM_DATA corresponds to where an error, incapable of being immediately corrected in the error correcting operation unit 522, occurs. For example, when assuming that the normal data NM_DATA is 16-bit data, since an error up to 2 bits among the 16-bit data may be immediately corrected by the error correcting operation unit 522 thorough a simple operation such as a parity checking scheme, it is not determined that an error occurs. Nevertheless, since it is impossible to immediately correct an error exceeding 3 bits, it is determined that an error occurs. Additionally, the reference by which the error correcting operation unit 522 determines the occurrence of an error may be changed in a variety of ways.

The error correcting operation unit 522 recovers the normal data NM_DATA in which an error occurs, based on the recovery read level interval SEL_VRR selected by the interval selection unit 506, during the error correcting operation mode ERM. That is to say, the error correcting operation unit 522 receives the recovery read level interval SEL_VRR selected by the interval selection unit 506, as the read interval of an LLR, during the error correcting operation mode ERM, performs an LDPC for the normal data NM_DATA in which an error occurs, and recovers the value of the normal data NM_DATA. Therefore, the error correcting operation unit 522 may perform the LDPC and recover the normal data NM_DATA in which an error occurs, in the state where information on the threshold voltage level distribution of the memory cells included in the nonvolatile memory device 500 is reflected on the read interval of the LLR.

Figure 7:
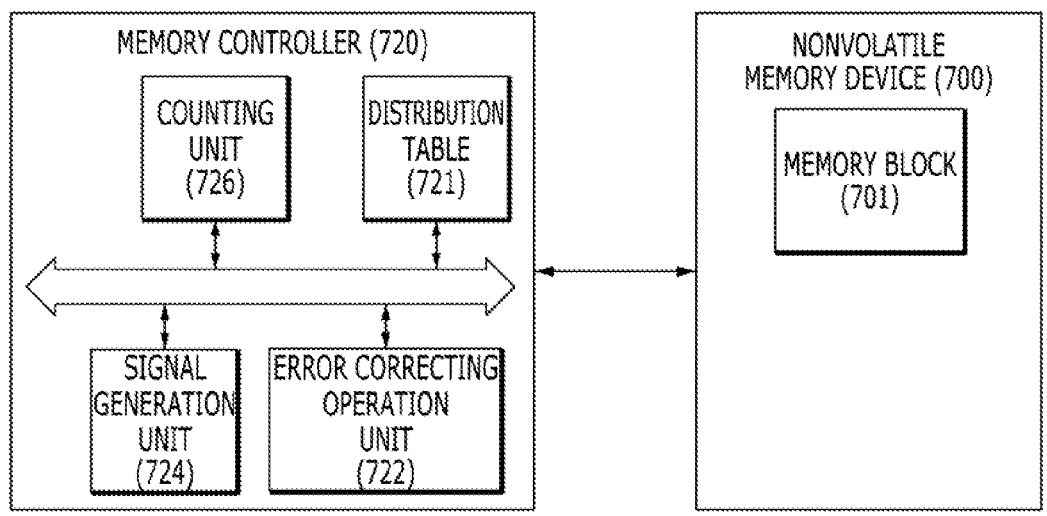
FIG. 7 is a block diagram of a nonvolatile memory system in accordance with an embodiment of the present invention.

FIG. 7 is a block diagram illustrating a nonvolatile memory system in accordance with an embodiment of the present invention. FIG. 5 shows configurations of a memory controller 720 and a nonvolatile memory device 700 which are based on the configuration of the memory system shown in FIG. 1.

Referring to FIG. 7, the nonvolatile memory device 700 may include a memory block 701. The memory block 701 may have the same configuration as the memory block 330 shown in FIG. 3. Accordingly, a plurality of memory cells are included in the memory block 701.

Further, the memory controller 720 may include a distribution table 721, an error correcting operation unit 722, a signal generation unit 724 and a counting unit 726.

The distribution table 721 stores recovery read level intervals set by being changed through M stages according to the distribution value of the threshold voltage levels of a plurality of memory cells, measured at a reference read level, and is changed through M stages.

The error correcting operation unit 722 may quickly find an LLR value from the distribution table 721, when performing an error correcting operation by using the LDPC scheme. By the error correcting operation unit 722, the error correcting operation may be performed quickly and effectively.

For reference, the distribution table 721 is a component element which is not illustrated in FIG. 1 and should be added to the memory controller 720 for this embodiment of the present invention. The error correcting operation unit 722 may be functionally added to the ECC unit 138 illustrated in FIG. 1. Also, the counting unit 726 and the signal generation unit 724 are additionally included in the memory controller 720 to support the operation of the error correcting operation unit 722. The counting unit 726 and the signal generation unit 724 may be added to the processor 134 illustrated in FIG. 1.

Figure 8:
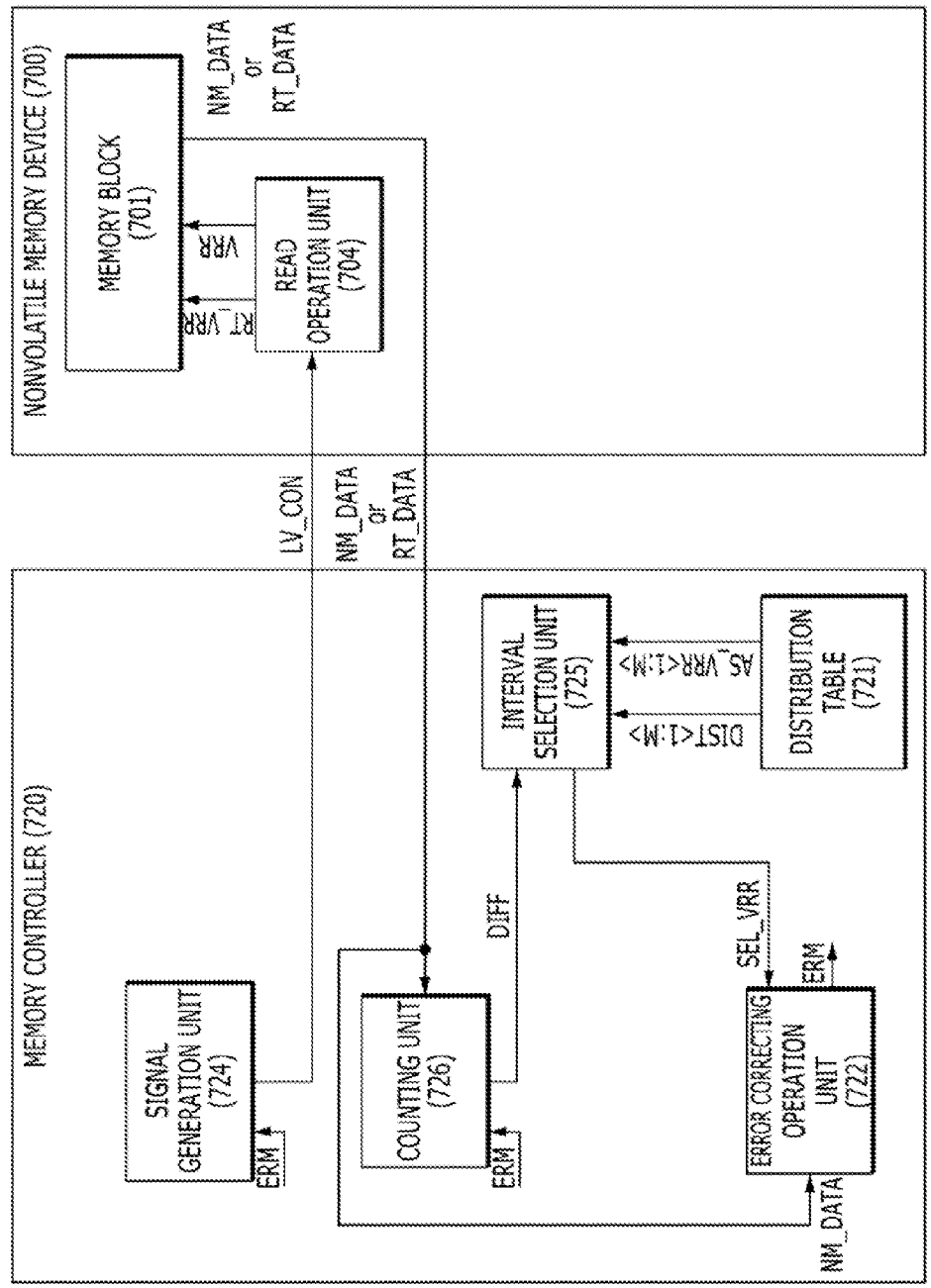
FIG. 8 is a detailed diagram of the nonvolatile memory system shown in FIG. 7.

FIG. 8 is a detailed diagram of the nonvolatile memory system shown in FIG. 7.

Referring to FIG. 8, the nonvolatile memory device 700 may include the memory block 701 and a read operation unit 704. Further, the memory controller 720 may include the signal generation unit 724, the counting unit 726, the distribution table 721, the error correcting operation unit 722, and an interval selection unit 725.

The data stored in the memory cells included in the memory block 701 may be read as normal data NM_DATA by using a reference read level VRR which is supplied from the read operation unit 704.

When entering an error correcting operation mode ERM, as an error that has occurred in the normal data NM_DATA may not be recovered by the operation of the error correcting operation unit 722, the data stored in the memory cells included in the memory block 701 may be read again as measurement data RT_DATA by using a measurement read level RT_VRR which is supplied from the read operation unit 704.

That is to say, the nonvolatile memory device 700 reads out the normal data NM_DATA or the measurement data RT_DATA from the memory cells included therein, under the control of the memory controller 720.

In detail, the read operation unit 704 generates the reference read level VRR or the measurement read level RT_VRR in response to a level control signal LV_CON which is transferred from the memory controller 720, and allows the data of the memory cells included in the memory block 701 to be read, as the normal data NM_DATA or the measurement data RT_DATA, based on the reference read level VRR or the measurement read level RT_VRR. That is to say, the read operation unit 704 generates the reference read level VRR in response to the value of the level control signal LV_CON corresponding to the period outside the error correcting operation mode ERM, and allows the data of the memory cells included in the memory block 701 to be read, as the normal data NM_DATA, based on the generated reference read level VRR. Further, the read operation unit 704 generates the measurement read level RT_VRR in response to the value of the level control signal LV_CON corresponding to the error correcting operation mode ERM, and allows the data of the memory cells included in the memory block 701 to be read, as the measurement data RT_DATA, based on the generated measurement read level RT_VRR. The level control signal LV_CON corresponding to the period outside the error correcting operation mode ERM may have a logic high level, and the level control signal LV_CON corresponding to the error correcting operation mode ERM may have a logic low level.

The memory controller 720 reads the data stored in the memory block 701 of the nonvolatile memory device 700, as the normal data NM_DATA, outside the error correcting operation mode ERM, and checks whether an error occurs in the read normal data NM_DATA.

Even when an error occurs in the normal data NM_DATA, the memory controller 720 recovers data without entering the error correcting operation mode ERM if the error correcting operation unit 722 may correct the error by itself. However, if the error correcting operation unit 722 cannot correct the error occurred in the read normal data NM_DATA by itself, the memory controller 720 enters the error correcting operation mode ERM, reads the data stored in the memory block 701 of the nonvolatile memory device 700 again, as the measurement data RT_DATA, and generates a difference value DIFF by counting a value difference from the normal data NM_DATA in which the error occurs.

The memory controller 720 searches M stages of distribution values DIST<1:M> stored in the distribution table 721 based on the difference value DIFF, and selects any one recovery read level interval SEL_VRR among M stages of recovery read level intervals AS_VRR<1:M> which correspond to the M stages of distribution values DIST<1:M>. The recovery read level interval SEL_VRR selected in this way may be a value that is optimized to recover the normal data NM_DATA in which the error occurs. Accordingly, the recovery read level interval SEL_VRR selected in the distribution table 721 is transferred to the error correcting operation unit 722, and is used in recovering the normal data NM_DATA in which the error occurs.

In detail, the signal generation unit 724 generates the level control signal LV_CON with a first value outside the error correcting operation mode ERM such that the normal data NM_DATA is read from the read operation unit 704, and generates the level control signal LV_CON with a second value during the error correcting operation mode ERM such that the measurement data RT_DATA is read from the read operation unit 704. In other words, the signal generation unit 724 serves to control the value of the level control signal LV_CON and determine which read voltage is to be used when reading data from the memory block 701. The first value of the level control signal LV_CON for reading the normal data NM_DATA may be a logic high level, and the second value of the level control signal LV_CON for reading the measurement data RT_DATA may be a logic low level.

The recovery read level intervals AS_VRR<1:M> which are set by being changed through M stages according to a distribution value DIST of the threshold voltage levels of the memory cells, measured at the reference read level VRR, is changed through M stages to generate the M stages of distribution values DIST<1:M>, are stored in the distribution table 721. In other words, the M stages of distribution values DIST<1:M> and the M stages of recovery read level intervals AS_VRR<1:M> are stored in the distribution table 721 in the form a table in which they are matched one-to-one.

The reason why the distribution value DIST of the threshold voltage levels of the memory cells stored in the distribution table 721 is changed through M stages to generate the M stages of distribution values DIST<1:M> is because the nonvolatile memory device 700 including the memory cells may be influenced by PVT variations. For example, referring to FIG. 4D, if the nonvolatile memory device 700 including the memory cells operates under a relatively bad environment, the distribution value DIST for the memory cells that is measured at the reference read level VRR may be 150 as a relatively high value. Conversely, if the nonvolatile memory device 700 including the memory cells operates under a relatively good environment, the distribution value DIST for the memory cells that is measured at the reference read level VRR may be 50 as a relatively low value.

As the distribution value DIST of the threshold voltage levels of the memory cells is changed through M stages to generate the M stages of distribution values DIST<1:M>, a recovery read level interval AS_VRR is also changed through M stages to generate the M stages of recovery read level intervals AS_VRR<1:M>. This is because a change in the distribution value DIST of the threshold voltage levels of the memory cells, measured at the reference read level VRR, means a change in the number of memory cells which have threshold voltage levels close to the reference read level VRR. For example, referring to FIG. 4D, where the distribution value DIST of the threshold voltage levels of the memory cells, measured at the reference read level VRR, is 150 as a relatively high value, the recovery read level interval AS_VRR is measured as 'LV2', which is relatively wide. Conversely, where the distribution value DIST of the threshold voltage levels of the memory cells, measured at the reference read level VRR, is 50 as a relatively low value, the recovery read level interval AS_VRR is measured as 'LV1' that is relatively narrow. For reference, the symbol M means a natural number equal to or larger than 2. Namely, the fact that each of the distribution value DIST and the recovery read level interval AS_VRR is changed through M stages means that each of the distribution value DIST and the recovery read level interval AS_VRR is changed through at least two stages.

It is to be noted that the distribution value DIST of the threshold voltage levels of the memory cells included in one nonvolatile memory device is one. Therefore, it is impossible for the distribution value DIST of the threshold voltage levels of the memory cells included in one nonvolatile memory device to be changed simultaneously through at least two stages. That is to say, in order to measure, at once, the distribution values DIST of the threshold voltage levels of the memory cells at the reference read level VRR that are changed through M stages to generate the M stages of distribution values DIST<1:M>, as included in the distribution table 721, results with different values should be acquired when the distribution values DIST of the threshold voltage levels of the pluralities of memory cells included in M number of nonvolatile memory devices are measured at the reference read level VRR. Thus, in order to figure out that the recovery read level Interval AS_VRR will have what values to generate the M stages of recovery read level Intervals AS_VRR<1:M>, in correspondence to the distribution value DIST of the threshold voltage levels of the memory cells measured at the reference read level VRR that is changed through M stages to generate the M stages of distribution values DIST<1:M>, a number of test operations should be performed in advance for a number of nonvolatile memory devices.

Hence, in the embodiment of the present invention, test operations are performed to allow the distribution values DIST of the threshold voltage levels of the memory cells that are stored in the distribution table 721 to be generated as the M stages of distribution values DIST<1:M>. In detail, while not directly shown in FIGS. 7 and 8, a scheme may be used wherein, after setting, in advance, when the distribution value DIST of the threshold voltage levels of a plurality of memory cells, measured at the reference read level VRR, is changed through M stages through test operations to generate the M stages of distribution values DIST<1:M>, by causing a plurality of nonvolatile memory devices each including a plurality of memory cells, in which the nonvolatile memory device 700 shown in FIGS. 7 and 8 is not included, to be placed under the influence of PVT environment that varies in a variety of ways, the recovery read level intervals AS_VRR<1:M> predicted through M stages are set according to the distribution values DIST<1:M> measured in the respective cases and are stored in the distribution table 721.

The M stages of distribution values DIST<1:M> and the M stages of recovery read level intervals AS_VRR<1:M> that may be measured through a plurality of test operations for the nonvolatile memory devices, in which the nonvolatile memory device 700 shown in FIGS. 7 and 8 is not included, may generally have the form as shown in FIG. 4D. In other words, a recovery read level interval AS_VRR with a relatively large level interval among the M stages of recovery read level intervals AS_VRR<1:M> may be set in correspondence to a distribution value DIST with a relatively large value among the M stages of distribution values DIST<1:M>, and a recovery read level interval AS_VRR with a relatively small level interval among the M stages of recovery read level intervals AS_VRR<1:M> may be set in correspondence to a distribution value DIST with a relatively small value among the M stages of distribution values DIST<1:M>. Which values the M stages of distribution values DIST<1:M> and the M stages of recovery read level intervals AS_VRR<1:M> will actually be changed variously according to which characteristics the nonvolatile memory devices used in the test operations, in which the nonvolatile memory device 700 shown in FIGS. 7 and 8 is not included, have. This is a matter to be controlled by a designer.

Meanwhile, in the operation of measuring the distribution value DIST of the threshold voltage levels of the memory cells included in one nonvolatile memory device by using the reference read level VRR, not only the reference read level VRR but also the measurement read level RT_VRR having a level substantially close to the reference read level VRR are used. Namely, after reading the data stored in the memory cells included in one nonvolatile memory device by respectively using the reference read level VRR and the measurement read level RT_VRR, the difference between two read data values is the distribution value DIST of the threshold voltage levels of the memory cells included in one nonvolatile memory device. That is to say, when assuming that the number of '1' among the values acquired by reading the data stored in the memory cells included in one nonvolatile memory device by using the reference read level VRR is 'K' and the number of '1' among the values acquired by reading the data stored in the memory cells included in one nonvolatile memory device by using the measurement read level RT_VRR is 'L', the difference 'K–L' is the distribution value DIST of the threshold voltage levels of the memory cells included in one nonvolatile memory device. Therefore, the M stages of distribution values DIST<1:M> may be acquired through a process of repeating an operation of reading the data of the memory cells included in one nonvolatile memory device by respectively using the reference read level VRR and the measurement read level RT_VRR each time one test operation is performed and then determining the difference between the values of two read data, as any one distribution value DIST among the M stages of distribution values DIST<1:M>. For reference, which levels the reference read level VRR and the measurement read level RT_VRR will have may be controlled in a variety of ways according to the characteristics of a nonvolatile memory device used in a measuring operation. Accordingly, which levels the reference read level VRR and the measurement read level RT_VRR will have may be controlled in a variety of ways by a designer.

The interval selection unit 725 receives the difference value DIFF generated by the counting unit 726 as the difference between the value of the normal data NM_DATA and the value of the measurement data RT_DATA, searches the M stages of distribution values DIST<1:M> stored in the distribution table 721 based on the difference value DIFF, and selects any one recovery read level interval SEL_VRR among the M stages of recovery read level intervals AS_VRR<1:M> according to the searched result. The interval selection unit 725 selects any one distribution value DIST among the M stages of distribution values DIST<1:M> stored in the distribution table 721, that is close to the difference value DIFF. For example, the interval selection unit 725 may compare sequentially the M stages of distribution values DIST<1:M> one by one with the difference value DIFF. When a comparison result is changed from a one-stage smaller state to a one-stage larger state or from a one-stage larger state to a one-stage smaller state, any one distribution value DIST corresponding to the one-stage larger state may be selected. Conversely, the interval selection unit 725 may compare sequentially the M stages of distribution values DIST<1:M> one by one with the difference value DIFF. When a comparison result is changed from a one-stage smaller state to a one-stage larger state or from a one-stage larger state to a one-stage smaller state, it may select any one distribution value DIST corresponding to the one-stage smaller state.

The counting unit 726 counts the difference of the normal data NM_DATA and the measurement data RT_DATA during the error correcting operation mode ERM, and determines the difference value DIFF. For example, when assuming that the number of '1' among the values of the normal data NM_DATA is 'K' and the number of '1' among the values of the measurement data RT_DATA is 'L', the counting unit 726 determines the difference 'K−L' as the difference value DIFF. It may be seen that the operation of the counting unit 726 is the same as the method used in the distribution table 721 to determine the M stages of distribution values DIST<1:M>. Namely, the difference value DIFF generated in the counting unit 726 may actually represent the distribution value of the threshold voltage levels of the memory cells included in the nonvolatile memory device 700. Accordingly, it may be possible to find a recovery read level interval SEL_VRR optimally corresponding to the distribution value of the threshold voltage levels of the memory cells included in the nonvolatile memory device 700, through the operations of the above-described interval selection unit 725 to search the M stages of distribution values DIST<1:M> stored in the distribution table 721 based on the difference value DIFF and select an optimized recovery read level interval SEL_VRR.

The error correcting operation unit 722 detects whether an error occurs in the normal data NM_DATA and determines whether to enter the error correcting operation mode ERM, outside the error correcting operation mode ERM. In detail, the error correcting operation unit 722 performs an operation of detecting whether an error occurs in the normal data NM_DATA read from the nonvolatile memory device 700 outside the error correcting operation mode ERM. When an error occurs, the error correcting operation unit 722 enters the error correcting operation mode ERM, and when an error has not occurred, the error correcting operation unit 722 continuously retains the state exited from the error correcting operation mode ERM. A reference for determining that an error occurs in the normal data NM_DATA corresponds to when an error incapable of being immediately corrected in the error correcting operation unit 722 occurs. For example, when assuming that the normal data NM_DATA is 16-bit data, since an error up to 2 bits among the 16-bit data may be immediately corrected by the error correcting operation unit 722 thorough a simple operation such as a parity checking scheme, it is not determined that an error occurs. Nevertheless, since it is impossible to immediately correct an error exceeding 3 bits, it is determined that an error occurs. For reference, a reference by which the error correcting operation unit 722 determines the occurrence of an error may be changed in a variety of ways by a designer.

The error correcting operation unit 722 recovers the normal data NM_DATA in which an error occurs, based on the recovery read level interval SEL_VRR selected by the interval selection unit 725, during the error correcting operation mode ERM. That is to say, the error correcting operation unit 722 receives the recovery read level interval SEL_VRR selected by the interval selection unit 725, as the read interval of an LLR, during the error correcting operation mode ERM, performs an LDPC for the normal data NM_DATA in which an error occurs, and recovers the value of the normal data NM_DATA. Therefore, the error correcting operation unit 722 may perform the low density parity check (LDPC) and recover the normal data NM_DATA in which an error occurs, in the state where information on the threshold voltage level distribution of the memory cells included in the nonvolatile memory device 700 is reflected on the read interval of the LLR.

As is apparent from the above descriptions, according to the embodiments of the present invention, information on recovery read points optimized according to variations in the distribution value of the threshold voltage levels of a plurality of memory cells, measured at a reference read level, is stored in a distribution table. After the distribution table is generated in advance through test operations, a most optimized read point used to recover data is searched from the distribution table and is then used, when an error occurs in the process of reading data using a reference read level. Through this, it may be possible to quickly find a read point most optimized to recover data, after a read operation in which an error occurs.

Due to this fact, high data reliability may always be achieved and performance deterioration may be prevented from occurring due to a data recovery operation, regardless of influences from the surrounding environment, such as variations in PVT, the method used and the duration of use.

Although various embodiments have been described for illustrative purposes, it will be apparent to those skilled in the art that various changes and modifications may be made without departing from the spirit and scope of the invention as defined in the following claims.

For example, it was described in the above embodiments that each of the plurality of memory cells is a single level cell (SLC) capable of storing 1-bit data. However, it is to be noted that this is merely an example, and the scope of the present invention is meant to cover when the memory cells are multi-level cell (MLC) capable of storing 2 or more-bit data.

What is claimed is:

1. A nonvolatile memory system comprising:
   a nonvolatile memory device including a distribution table suitable for storing recovery read voltage level intervals that are set by being changed through multiple stages according to a distribution value of threshold voltage levels of a plurality of memory cells, measured at a reference read voltage level, is changed through the multiple stages; and
   a memory controller suitable for reading measurement data from the memory cells by additionally using a measurement read voltage level, searching for a difference value between normal data and the measurement data from the multiple stages of distribution values stored in the distribution table, and recovering the normal data based on a recovery read voltage level interval corresponding to the searched distribution value, when an error occurs in the normal data read from the memory cells by using the reference read voltage level,
   wherein the nonvolatile memory device further includes:
   a read operation unit suitable for generating the reference read voltage level or the measurement read voltage level based on a voltage level control signal, and reading the data of the memory cells based on the reference read voltage level or the measurement read voltage level; and an interval selection unit suitable for searching the multiple stages of distribution values stored in the distribution table based on the difference value transferred from the memory controller, and selecting any one recovery read voltage level interval corresponding to the searched result among the multiple stages of recovery read voltage level intervals stored in the distribution table, and wherein the reference read voltage level is a reference voltage value of recovery read voltage level interval.

2. The nonvolatile memory system according to claim 1, wherein, after setting, in advance, cases where the distribution value of the threshold voltage levels of flail the plurality of memory cells, measured at the reference read voltage level, is changed through the multiple stages through test operations to generate the multiple stages of distribution values, the recovery read voltage level intervals predicted through the multiple stages are set according to distribution values measured in the respective cases and are stored in the distribution table.

3. The nonvolatile memory system according to claim 2, wherein, in the each of the cases through the test operations, after reading data stored in the memory cells by respectively using the reference read voltage level and the measurement read voltage level, a difference between two read data values is measured as any one distribution value among the multiple stages of distribution values.

4. The nonvolatile memory system according to claim 3, wherein, in the each of the cases through the test operations, a recovery read voltage level interval with a relatively large voltage level interval among the multiple stages of recovery read voltage level intervals is set in correspondence to a distribution value with a relatively large value among the multiple stages of distribution values, and a recovery read voltage level interval with a relatively small voltage level interval among the multiple stages of recovery read voltage level intervals is set in correspondence to a distribution value with a relatively small value among the multiple stages of distribution values.

5. The nonvolatile memory system according to claim 1, wherein the interval selection unit compares sequentially the multiple stages of distribution values stored in the distribution table one by one with the difference value and, when a comparison result is changed from a one-stage smaller state to a one-stage larger state or from a one-stage larger state to a one-stage smaller state, selects any one distribution value corresponding to the one-stage larger state as the searched result.

6. The nonvolatile memory system according to claim 1, wherein the interval selection unit compares sequentially the multiple stages of distribution values stored in the distribution table one by one with the difference value and, when a comparison result is changed from a one-stage smaller state to a one-stage larger state or from a one-stage larger state to a one-stage smaller state, selects any one distribution value corresponding to the one-stage smaller state as the searched result.

7. The nonvolatile memory system according to claim wherein the memory controller includes:

a signal generation unit suitable for generating the voltage level control signal with a first value outside an error correcting operation mode such that the normal data is read from the read operation unit, and generating the voltage level control signal with a second value during the error correcting operation mode such that the measurement data is read from the read operation unit;

a counting unit suitable for counting the difference of the normal data and the measurement data during the error correcting operation mode to determine the difference value; and an error correcting operation unit suitable for detecting whether an error occurs in the normal data to determine when to enter the error correcting operation mode, and recovering, during the error correcting operation mode, the normal data in which an error occurs, based on the recovery read voltage level interval selected by the interval selection unit.

8. The nonvolatile memory system according to claim 1, wherein the memory controller receives the recovery read voltage level interval, as a read interval of a log likelihood ratio, performs a low density parity check for the normal data in which an error occurs, and recovers a value of the normal data.

9. A nonvolatile memory system comprising:

a nonvolatile memory device including a plurality of memory cells; and a memory controller including a distribution table suitable for storing recovery read voltage level intervals that are set by being changed through multiple stages according to a distribution value of threshold voltage levels of the memory cells, measured at a reference read voltage level, is changed through the multiple stages, wherein, when an error occurs in normal data read from the memory cells by using the reference read voltage level, the memory controller reads measurement data from the memory cells by additionally using a measurement read voltage level, searches for a difference value between the normal data and the measurement data from the multiple stages of distribution values stored in the distribution table, and recovers the normal data based on a recovery read voltage level interval corresponding to the searched distribution value, wherein the nonvolatile memory device further includes:

a read operation unit suitable for generating the reference read voltage level or the measurement read voltage level based on a voltage level control signal, and reading the data of the memory cells based on the reference read voltage level or the measurement read voltage level, wherein the memory controller further includes:

an interval selection unit suitable for searching the difference value from the multiple stages of distribution values stored in the distribution table, and selecting any one recovery read voltage level interval corresponding to a search result among the multiple stages of recovery read voltage level intervals stored in the distribution table, and wherein the reference read voltage level is a reference voltage value of recovery read voltage level interval.

10. The nonvolatile memory system according to claim 9, wherein, after setting, in advance, cases where the distribution value of the threshold voltage levels of the plurality of memory cells, measured at the reference read voltage level, is changed through the multiple stages through test operations to generate the multiple stages of distribution values, the recovery read voltage level intervals predicted through the multiple stages are set according to distribution values measured in the respective cases and are stored in the distribution table.

11. The nonvolatile memory system according to claim 10, wherein, in the each of the cases through the test operations, after reading data stored in the memory cells by respectively using the reference read voltage level and the measurement read voltage level, a difference between two read data values is measured as any one distribution value among the multiple stages of distribution values.

12. The nonvolatile memory system according to claim 11, wherein, in the each of the cases through the test operations, a recovery read voltage level interval with a relatively large voltage level interval among the multiple stages of recovery read voltage level intervals is set in correspondence to a distribution value with a relatively large value among the multiple stages of distribution values, and a recovery read voltage level interval with a relatively small voltage level interval among the multiple stages of recovery read voltage level intervals is set in correspondence to a distribution value with a relatively small value among the multiple stages of distribution values.

13. The nonvolatile memory system according to claim 9, wherein the memory controller further includes:
    a signal generation unit suitable for generating the voltage level control signal with a first value outside an error correcting operation mode such that the normal data is read from the read operation unit, and generating the voltage level control signal with a second value during the error correcting operation mode such that the measurement data is read from the read operation unit;
    a counting unit suitable for counting the difference of the normal data and the measurement data during the error correcting operation mode to determine the difference value; and
    an error correcting operation unit suitable for detecting whether an error occurs in the normal data and determining when to enter the error correcting operation mode, and recovering the normal data in which an error occurs, based on the recovery read voltage level interval selected by the interval selection unit, during the error correcting operation mode.

14. The nonvolatile memory system according to claim 13, wherein the interval selection unit compares sequentially the multiple stages of distribution values stored in the distribution table one by one with the difference value and, when a comparison result is changed from a one-stage smaller state to a one-stage larger state or from a one-stage larger state to a one-stage smaller state, selects any one distribution value corresponding to the one-stage larger state as the searched result.

15. The nonvolatile memory system according to claim 13, wherein the interval selection unit compares sequentially the multiple stages of distribution values stored in the distribution table one by one with the difference value and, when a comparison result is changed from a one-stage smaller state to a one-stage larger state or from a one-stage larger state to a one-stage smaller state, selects any one distribution value corresponding to the one-stage smaller state as the searched result.

16. The nonvolatile memory system according to claim 9, wherein the memory controller receives the recovery read voltage level interval, as a read interval of a log likelihood ratio, performs a low density parity check for the normal data in which an error occurs, and recovers a value of the normal data.

17. A data recovery method of a nonvolatile memory system including a plurality of memory cells, the method comprising:
    generating a distribution table, wherein the distribution table stores recovery read voltage level intervals that are set by being changed through multiple stages according to a distribution value of threshold voltage levels of the memory cells, measured at a reference read voltage level, is changed through the multiple stages;
    reading normal data from the memory cells by using the reference read voltage level;
    reading measurement data from the memory cells by additionally using a measurement read voltage level when an error occurs in the normal data;
    searching a difference value between the normal data and the measurement data from the multiple stages of distribution values stored in the distribution table; and
    recovering the normal data based on a recovery read voltage level interval corresponding to the searched distribution value,
    wherein the generating of the distribution table includes generating the reference read voltage level or the measurement read voltage level based on a voltage level control signal, and reading the data of the memory cells based on the reference read voltage level or the measurement read voltage level; and
    wherein the searching of the difference value includes searching the multiple stages of distribution values stored in the distribution table based on the difference value between the normal data and the measurement data, and selecting any one recovery read voltage level interval corresponding to the searched result among the multiple stages of recovery read voltage level intervals stored in the distribution table, and
    wherein the reference read voltage level is a reference voltage value of recovery read voltage level interval.

18. The data recovery method of claim 17, wherein the distribution table is generated through test operations.

* * * * *